Aug. 30, 1966 G. R. KILP ET AL 3,269,871

MULTIPLE JUNCTION UNITARY THERMOELECTRIC DEVICE

Filed Nov. 14, 1960

INVENTORS
Gerald R. Kilp &
Paul M. Bergstrom
BY
Frederick Shapoe
ATTORNEY

United States Patent Office 3,269,871
Patented August 30, 1966

3,269,871

MULTIPLE JUNCTION UNITARY THERMO-ELECTRIC DEVICE

Gerald R. Kilp, Penn Hills, and Paul M. Bergstrom, Irwin, Pa., assignors to Westinghouse Electric Corporation, East Pittsburgh, Pa., a corporation of Pennsylvania Filed Nov. 14, 1960, Ser. No. 69,083
14 Claims. (Cl. 136—203)

The present invention relates to a unitary thermoelectric device and a method of preparing the same.

Heretofore many problems have arisen in the fabrication of thermoelectric devices especially those of the multiple junction type. The multiple junction thermoelectric devices usually consist of a plurality of individual thermoelectric pellets, an insulating material interposed between the pellets and a contact or connecting member joining the pellets in a desired circuitry. All of these components are individually prepared and assembled and the pellets joined by more or less individual treatment.

Initially, it is difficult to prepare uniformly reliable thermoelectric pellets since the pellets produced by casting or pressing are usually quite brittle, are easily damaged, must be processed to size and shape, and are expensive to handle as individual units. Another problem exists in the selection and the application of an insulating material which will electrically insulate and separate the pellets while having desired low termal conductivity characteristics.

However, even when these initial problems are substantially solved, more complex problems emanate in the production of multiple junction thermoelectric devices. It is extremely difficult to assemble a reliable device complete with properly applied conducting and insulating means between a great number of pellets owing to the previosuly mentioned characteristics inherently present in the basic components of the device.

In order to produce an economical, efficient thermoelectric device, the thermoelectric pellets should be positioned as closely together as possible, while being electrically insulated by a thermally insulating material, so as to be able to absorb or accommodate the stresses produced through the temperature range of operation without fracturing the thermoelectric pellet. Also, a convenient, simplified method is desired for connecting the pellets in a desired circuitry.

In some instances the pellets are first positioned in association with an insulating member and the electrically conductive straps or means connecting the pellets subsequently attached, as by soldering, one by one to the ends of the pellets. This causes additional expense and labor and possible damage to pellets due to the handling. Furthermore, in joining contacts to thermoelectric materials in this manner, solder materials especially compatible with both the thermoelectric material and the electrical conductor so as to effect good joints must be employed with each specific thermoelectric material. The solder must also be selected according to its ability to absorb stresses without causing damage to the thermoelectric pellet and not react with or otherwise impair the thermoelectric material.

An object of the present invention is to provide a process for producing a unitary assembly comprising a plurality of thermoelectric members completely insulated electrically from each other by a matrix comprising a compacted insulating material with desired low thermal conductivity characteristics in which electrical conductors connecting the bodies in a particular circuitry are attached to the ends of pairs of members, all being prepared substantially in close sequence in the basic forming operation to provide an integral solid body.

A further object of the invention is to provide a process for producing in sequential steps an integral unitary thermoelectric assembly comprising molding a thermally and electrically insulating material into a body having a plurality of perforations extending from one surface to another, with interconnecting indentations on at least one surface extending between pairs of perforations, molding thermoelectric material in each perforation, pressing electrically conducting material in the interconnecting indentations so as to electrically join the thermoelectric material molded in the perforations, and sintering the molded member to produce a strong unitary device.

Another object of the invention is to provide a thermoelectric device comprising a shaped body of compactible electrically insulating, low thermal conductivity material having a plurality of perforations extending between the upper and lower end surfaces of the body, a plurality of interconnecting indentations being provided in at least one of the end surfaces of the body disposed between pairs of perforations, a plurality of compacted thermoelectric members, each member being disposed in a single perforation and conforming closely and intimately therewith, and a compacted electrically conductive material disposed in the indentations and conforming intimately therein, said electrically conductive material intimately and adherently contacting the ends of the thermoelectric members to provide a good conductor therebetween.

Other objects of the invention will, in part, be obvious and will, in part, appear hereinafter.

For a better understanding of the nature and objects of the invention, reference should be had to the following detailed description and drawings, in which.

Figure 1:
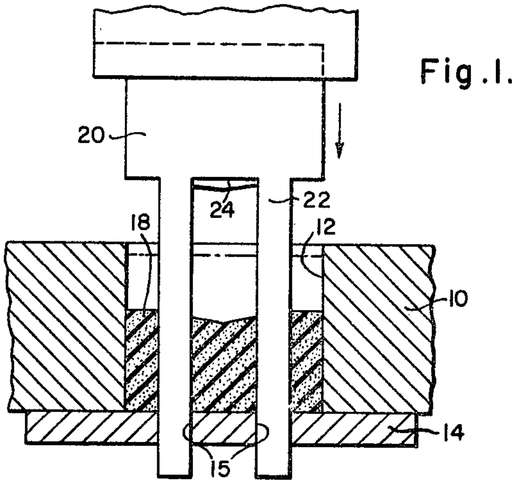
FIGURE 1 is an elevation view partly in cross section of an apparatus and procedure which may be used to carry out the teachings of the invention.

In accordance with the present invention and in attainment of the foregoing objects, there is provided a method of preparing a unitary thermoelectric device by initially compacting under pressure a quantity of an electrically and thermally insulating material, usually in powdered or flake form, into a perforated compact of a desired density. The insulating matrix may consist of any good inorganic insulating material, for example, a lead borate glass bonded mica, sold under the trade names of Mycalex and glass fiber inorganic binder sold as Superex. Inorganic refractories such as magnesium oxide, magnesium silicate, and aluminum oxide and mixtures of two or more with fibrous filling such as asbestos, glass fibers or mica flakes added, or organic insulating materials such as melamine or epoxy resin molding compositions may also be employed. The compact of the insulating material is provided with a plurality of perforations extending between the upper and lower surfaces. The compact also contains a plurality of interconnecting indentations on one or both surfaces of the compact disposed between pairs of the perforations. The indentations are preferably formed at the same time as the perforations are made or they may be formed subsequently in a separate pressing or machining step.

A quality of compactible thermoelectric material is placed in each of the perforations in the compact and an electrically conductive material is placed in the inner-connecting indentations. The thermoelectric material placed in some of the perforations will be of a different composition than the others to provide an equal number of p- and n-type materials, the geometrical distribution depending on the type of circuitry desired. The material in any perforation may comprise different compositions, applied in separate layers, in accordance with the thermal properties of the material under service. Thus, the first 50% may be zinc antimonide and the other 50% by volume may be lead telluride. The electrically conductive material in the indentations may be composed of the thermoelectric materials or mixtures thereof employed in filling the perforations or may be composed of a powdered metal.

The applied thermoelectric material is then compressed to fill the perforations and to conform intimately to the walls of the perforations thus being supported thereby and to provide a high density thermoelectric member in each perforation. The electrically conductive material disposed in the indentations is also compressed so as to provide a good conductor between the compacted thermoelectric material filling the perforations. Due to the fact that the materials in both the perforations and indentations are powdered, the compressing results in excellent bonds between them. The entire device may be further compressed, if desired, at its upper and lower surfaces to produce substantially flush end surfaces and a high overall density. Finally, the device is preferably sintered into an integral unitary solid body. However, the sintering may be effected by hot compacting the thermoelectric material in the perforations in the previous step, under suitable heat and pressure.

With reference to the drawings, there is shown a typical method and apparatus for carrying out the teachings of the invention. In FIG. 1, there is shown a die 10 having walls 12 forming a well and a perforated movable support 14. The movable support 14 contains perforations 15 in certain selected portions, other portions being unperforated so that either the perforated or the unperforated portion of support 14 may be moved into position to provide a bottom closure for the well. A measured quantity of compactible electrically and thermally insulating material 18 is placed in the well 12 while a ram 20 is in the open die position of FIG. 1, and the material is thereafter compressed by the ram 20 having punches 22 closely fitting the perforations 15 and indentation-forming projection 24. The ram 20 is applied under a high pressure to the insulating material to compress it to a desired density and to provide perforations in the compact and to provide indentations between pairs of perforations in said material. While only two punches are shown in FIG. 1, a great number may be present. The support 14 is aligned so that the ends of the punches 22 pass through the perforations in the support during compression of the insulating material so that the perforations extend between the upper and lower surfaces of the compact. Indentation-forming projections also may be disposed on the support 14 between pairs of perforations other than those bridged by projection 24 to provide indentations between a desired pattern of perforations on the lower face of the compact of the insulating material.

Figure 2:
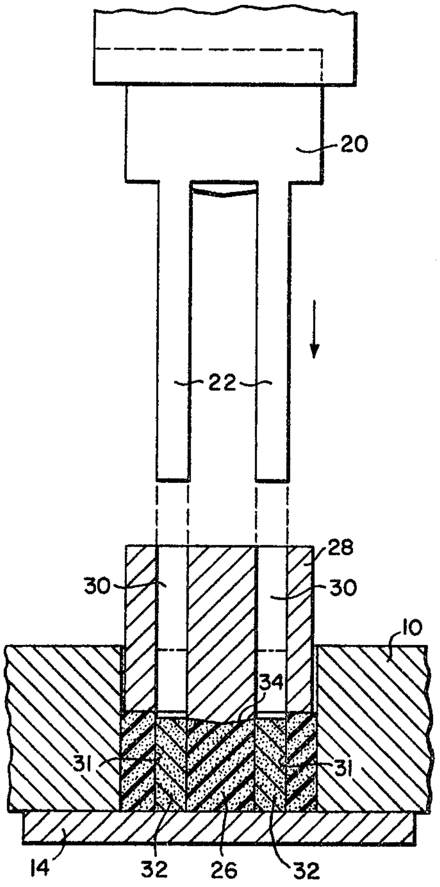
FIG. 2 is an elevation view partly in cross section of an intermediate step using the apparatus of FIG. 1 in carrying out the process of the invention.

Referring to FIG. 2, the ram 20 is withdrawn from the resulting compact 26 and a loading block 28 having a plurality of perforations 30 is disposed on the upper end of the compact, said perforations 30 being aligned with the perforations 31 in the compact. The perforations 31 in the compact 26 are then filled with a thermoelectric material indicated generally as 32, though each of two perforations will contain different materials, through the perforations 30 in the loading block 28, the upper level of the loose material 32 extending well into perforation 30. The ram 20 with its punches 22 is then applied to the thermoelectric material through the perforations 30 in the loading block, and the thermoelectric material is compressed to a desired density to provide a plurality of thermoelectric members, the ends of the thermoelectric members being flush with or slightly below the surfaces of the insulating compact.

Thereafter the block 28 is removed and the indentations 34 and any depression in the ends of the perforations 31 in the insulating compact 26 are filled with a thermoelectric material or with an electrically conductive powdered metal. A thin jig may be employed to enable a volumetric excess of loose powder to be applied to each indentation and end of perforation 31. Either a shaped punch or a flat surface punch is applied to the compact, to compress the material into the indentations 34 and to bond it to the thermoelectric material in perforations 31 of the compact 26.

It should be understood that the perforations 31 and compact 26 may be filled with different types of thermoelectric materials depending on the type of circuitry desired. For example, in each pair of perforations, lead telluride may be placed in one perforation and germanium bismuth telluride may be placed in the other perforation. Copper powder or mixtures of the two thermoelectric materials may be used, if desired, to provide the conductive means in the indentations between pairs of thermoelectric members.

Figure 3:
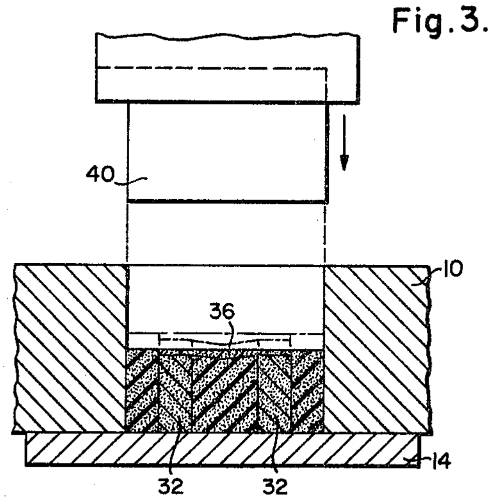
FIG. 3 is an elevation view partly in cross section of a subsequent step in carrying out the process of the invention.

As illustrated in FIG. 3, the compact 26 containing the compacted thermoelectric material 32 and conductive means 36 may be further compressed to a high density by applying under pressure to the top surface of the compact a flat surfaced ram 40 to produce substantially flush end surfaces.

Up to this point in the process, the compact 26 contains a plurality of thermoelectric members with electrical connecting means between pairs of thermoelectric members on the upper end of the insulating compact. Various methods may be employed to provide electrical connecting means on the lower end of the insulating compact to provide a complete circuit for the thermoelectric members. For example, if indentations were formed on the lower end of the insulating compact between pairs of perforations as was mentioned earlier, the ends of the insulating compact may be reversed in the die, and the lower end indentations filled with a conductive material and compressed in the same manner as the upper end. In the case where only the upper end of the insulating compact contains indentations between perforations, the thermoelectric members may be electrically connected on the lower end by soldering electrically conductive straps across certain pairs of thermoelectric members. The device is then sintered to a cured solid unitary body.

Figure 4:
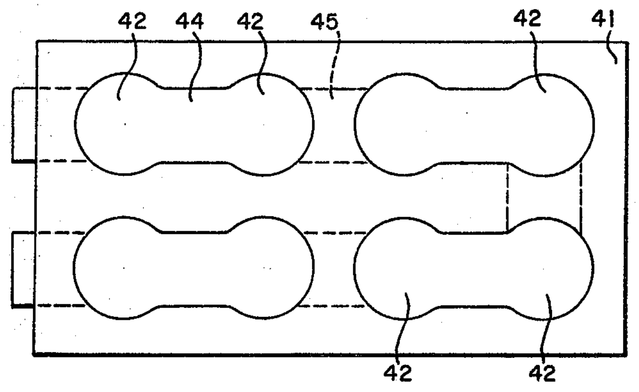
FIG. 4 is a plan view of a thermoelectric device produced in accordance with the invention.

It should be understood that while the drawings only show an insulating compact 26 containing a pair of thermoelectric members 32, the compressing ram 20 may contain any number of punches 22 with indentation-forming projections 24 located between certain pairs of said punches. Referring to FIG. 4, there is shown a thermoelectric device 41 made by the process disclosed herein. The drawing shows cylindrical thermoelectric members 42 in paired configuration connected in series by means of conductors 44 and 45. However, the members may be connected in other types of circuits by merely placing the indentation-forming projections on the compressing ram between the desired pairs of punches.

While the unitary thermoelectric device is illustrated as having flat surfaces, it will be understood that the upper and lower surfaces can be curved as that the device can be applied to any suitable surface. For example, the walls of a circular furnace may be fitted with one or more of the curved unitary thermoelectric devices closely conforming to the walls of the furnace.

It will be apparent that the unitary devices prepared in accordance with the invention are extremely rugged and durable. The process eliminates the separate preparation and handling of numerous individual thermoelectric pellets. Soldering to each end of each pellet is eliminated. Expense and labor and possible damage to pellets due to the handling are substantially reduced.

The following example is illustrative of the teachings of the invention. A die cavity similar to the one shown in FIG. 1 is filled with a fibrous electrically and thermally insulating material selling under the trade name Superex, and the material is compressed with a ram having a pair of punches with indentation-forming projections therebetween. The insulating material is compressed to approximately 65% of its theoretical density. One of the perforations in the insulating compact is filled with powdered germanium telluride while the other is filled with lead telluride and the powders are compressed to 70% theoretical density by applying the punches on the ram to the upper end of said material. Copper powder is then placed in the indentation between the pair of thermoelectric compacts and the copper powder is also compressed to approximately 70% of its theoretical density. The entire unit is then compressed at a high prsesure to full densification using a ram similar to that shown in FIG. 3. The unit is then sintered to a final solid unitary body. The insulating material when fully constrained and molded under high pressure exerts a highly beneficial isostatic action on the thermoelectric material thereby substantially increasing the density and structural strength of the thermoelectric material.

The resulting unitary integral thermoelectric device was suitable for incorporation into electrical generators which operate by applying heat to one face and dissipating heat from the other face. Radiators or heat exchange means can be placed on the faces by simple clamping or by soldering. The device can also be employed to produce refrigeration by passing electrical current through the conductors.

It is intended that the above description and drawing be interpreted as illustrative and not limiting.

We claim as our invention:

1. In the method of preparing a thermoelectric device the steps comprising compacting under pressure a quantity of an electrically and thermally insulating material into a compact of a desired density and having upper and lower substantially flat end surfaces, a plurality of perforations extending between the upper and lower end surfaces and a plurality of interconnecting indentations in at least one of the end surfaces disposed between pairs of perforations, placing a quantity of compactible thermoelectric material in each of the perforations in the compact and an electrically conductive material in the interconnecting indentations, compressing the applied thermoelectric material to fill the perforations so as to provide a high density thermoelectric member in each perforation, and also compressing the electrically conductive material in the indentations so as to provide an electrical conductor between the compacted thermoelectric material filling the paired perforations.

2. In the method of preparing a thermoelectric device the steps comprising compacting under pressure a quantity of an electrically and thermally insulating material into a compact of a desired density and having upper and lower substantially flat end surfaces, a plurality of perforations extending between the upper and lower end surfaces and a plurality of interconnecting indentations in at least one of the end surfaces disposed between pairs of perforations, placing a quantity of compactible thermoelectric material in each of the perforations in the compact and an electrically conductive material in the interconnecting indentations, compressing the applied thermoelectric material to fill the perforations so as to provide a high density thermoelectric member in each perforation, and also compressing the electrically conductive material in the indentations so as to provide an electrical conductor between the compacted thermoelectric material filling the paired perforations, and sintering the resulting member to a final integrally unitary solid body.

3. In the method of preparing a thermoelectric device the steps comprising compacting under pressure a quantity of an electrically and thermally insulating material into a compact of a desired density and having upper and lower substantially flat end surfaces, a plurality of perforations extending between the upper and lower end surfaces and a plurality of interconnecting indentations in at least one of said end surfaces disposed between pairs of perforations, placing a quantity of compactible thermoelectric material in each of the perforations in the compact and an electrically conductive material in the interconnecting indentations, compressing the applied thermoelectric material to fill the perforations so as to provide a high density thermoelectric member in each perforation, also compressing the electrically conductive material in the indentations so as to provide an electrical conductor between the compacted thermoelectric material filling the paired perforations, and finally compressing the device at its end surface to produce substantially flush end surfaces and a high overall density.

4. In the method of preparing a thermoelectric device the steps comprising compacting under pressure a quantity of an electrically and thermally insulating material into a compact of a desired density and having upper and lower substantially flat end surfaces, a plurality of perforations extending between the upper and lower end surfaces and a plurality of interconnecting indentations in at least one of the end surfaces disposed between pairs of perforations, placing a quantity of compactible thermoelectric material in each of the perforations in the compact and an electrically conductive material in the interconnecting indentations, compressing the applied thermoelectric material to fill the perforations so as to provide a high density thermoelectric member in each perforation, also compressing the electrically conductive material in the indentations so as to provide an electrical conductor between the compacted thermoelectric material filling the paired perforations, and finally compressing the device at its end surfaces to produce substantially flush end surfaces and a high overall density and sintering the resulting member to a final integrally unitary solid body.

5. The process of claim 1 wherein the electrically conductive material comprises a thermoelectric material.

6. The process of claim 1, wherein the electrically conductive material comprises a powdered metal.

7. The process of claim 1, including applying the electrically conductive material to indentations in both end surfaces of the compact to interconnect the thermoelectric material in all of the perforations.

8. The process of claim 1, wherein the electrically and thermally insulating material comprises an inorganic material.

9. In the method of preparing a thermoelectric device the steps comprising compacting under pressure a quantity of an electrically and thermally insulating material into a compact of a desired density and having upper and lower substantially flat end surfaces, a plurality of perforations extending between the upper and lower end surfaces and a plurality of interconnecting indentations in at least one of the end surfaces disposed between pairs of perforations, placing a quantity of compactible thermoelectric material in each of the perforations in the compact and an electrically conductive material in the interconnecting indentations, compressing under heat and pressure the applied thermoelectric material filling the perforations so as to provide a high density thermoelectric member in each perforation, and also compressing the electrically conductive material in the indentations so as to provide a good electrical conductor between the compacted thermoelectric material filling the paired perforations whereby the combination of heat and pressure produces a cured integral solid body.

10. A sintered thermoelectric device comprising a shaped body of compacted electrically and thermally insulating material having a plurality of perforations extending between the upper and lower end surfaces of the body, a plurality of thermoelectric members comprising material compacted within the perforations so as to conform intimately to the walls of the perforation and being supported thereby, said material having been compacted while in the perforation, and electrically conductive materials contacting ends of pairs of thermoelectric members and being flush with the end surfaces of the body to provide a thermoelectric conductor therebetween.

11. The thermoelectric device of claim 10, wherein the electrically conductive material comprises a thermoelectric material.

12. The thermoelectric device of claim 10, wherein the electrically conductive material comprises a powdered metal.

13. The thermoelectric device of claim 10, wherein the electrically conductive material is disposed in indentations in both end surfaces of the compact to interconnect the thermoelectric material in all of the perforations.

14. The thermoelectric device of claim 10, wherein the electrically and thermally insulating material comprises an inorganic material.

References Cited by the Examiner

UNITED STATES PATENTS

| | | | |
|---|---|---|---|
| 1,848,655 | 3/1932 | Petrik | 136—4.2 |
| 2,229,481 | 1/1941 | Telkes | 136—5 |
| 2,289,152 | 7/1942 | Telkes | 136—5 |
| 2,652,520 | 9/1953 | Studders | 75—208 |
| 2,952,980 | 9/1960 | Douglas | 136—5 |

FOREIGN PATENTS

| | | |
|---|---|---|
| 587,490 | 4/1947 | Great Britain. |

OTHER REFERENCES

Horne et al.: RCA Technical Notes, No. 304, November 1959.

WINSTON A. DOUGLAS, *Primary Examiner.*

JOSEPH R. SPECK, *Examiner.*

J. BARNEY, A. M. BEKELMAN, *Assistant Examiners.*